United States Patent
Iwamoto

(10) Patent No.: US 10,424,716 B2
(45) Date of Patent: Sep. 24, 2019

(54) METHOD FOR PRODUCING PIEZOELECTRIC DEVICE

(71) Applicant: Murata Manufacturing Co., Ltd., Nagaokakyo-shi, Kyoto-fu (JP)

(72) Inventor: Takashi Iwamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 259 days.

(21) Appl. No.: 15/379,530

(22) Filed: Dec. 15, 2016

(65) Prior Publication Data

US 2017/0098754 A1    Apr. 6, 2017

Related U.S. Application Data

(60) Division of application No. 14/164,318, filed on Jan. 27, 2014, now Pat. No. 9,577,178, which is a (Continued)

(30) Foreign Application Priority Data

Jul. 29, 2011  (JP) ................................ 2011-166586

(51) Int. Cl.
*H01L 41/047* (2006.01)
*H01L 41/297* (2013.01)
(Continued)

(52) U.S. Cl.
CPC ...... *H01L 41/0477* (2013.01); *H01L 41/0815* (2013.01); *H01L 41/297* (2013.01);
(Continued)

(58) Field of Classification Search
CPC ............. H01L 41/0477; H01L 41/0815; H01L 41/297; H01L 41/312; H01L 41/313;
(Continued)

(56) References Cited

U.S. PATENT DOCUMENTS 7,600,303 B1 * 10/2009 Hamou ................... Y10T 29/42
                                                         216/13
2001/0018254 A1 * 8/2001 Yamamoto ........ H01L 21/02189
                                                         438/301

(Continued)

FOREIGN PATENT DOCUMENTS

JP          2009231405 A  * 10/2009

OTHER PUBLICATIONS

Iwamoto, "Piezoelectric Device and Method for Producing Piezoelectric Device", U.S. Appl. No. 14/164,318, filed Jan. 27, 2014.

*Primary Examiner* — A. Dexter Tugbang
(74) *Attorney, Agent, or Firm* — Keating & Bennett, LLP

(57) ABSTRACT

A method for producing a piezoelectric device includes a laminate formation step in which a laminate including a piezoelectric thin film, a support substrate, a metal layer, and a silicon oxide film respectively stacked on both of an upper surface and a lower surface of the metal layer interposed between the piezoelectric thin film and the support substrate is formed, a semi-conducting layer formation step in which a semi-conducting layer is formed by oxidizing the metal layer, and a functional electrode formation step in which a functional electrode that is electro-mechanically coupled to the piezoelectric thin film is formed on a first principal surface of the piezoelectric thin film. The semi-conducting layer is a layer composed of a mixture of a metal constituting the metal layer and an oxide thereof, or a layer composed of a semiconductor which is an oxide of a metal constituting the metal layer.

5 Claims, 10 Drawing Sheets

Related U.S. Application Data continuation of application No. PCT/JP2012/068788, filed on Jul. 25, 2012.

(51) Int. Cl.
*H01L 41/312* (2013.01)
*H01L 41/08* (2006.01)
*H01L 41/313* (2013.01)
*H03H 9/02* (2006.01)
*H03H 3/04* (2006.01)
*H03H 3/10* (2006.01)
*H03H 3/02* (2006.01)

(52) U.S. Cl.
CPC .......... *H01L 41/312* (2013.01); *H01L 41/313* (2013.01); *H03H 3/04* (2013.01); *H03H 3/10* (2013.01); *H03H 9/02574* (2013.01); *H03H 2003/023* (2013.01); *H03H 2003/0407* (2013.01); *Y10T 29/42* (2015.01)

(58) Field of Classification Search
CPC ......... H01L 21/02178; H01L 21/02189; H01L 2003/023; H01L 2003/0407; H03H 3/04; H03H 3/10; Y10T 29/49005; Y10T 29/42
See application file for complete search history.

(56) References Cited

U.S. PATENT DOCUMENTS

2009/0295506 A1* 12/2009 Handtmann ............ Y10T 29/42
  333/192
2010/0107388 A1*  5/2010 Iwamoto ............... H01L 41/313
  29/25.35

* cited by examiner

METHOD FOR PRODUCING PIEZOELECTRIC DEVICE

BACKGROUND OF THE INVENTION

1. Field of the Invention

The present invention relates to a piezoelectric device in which a piezoelectric thin film is bonded to a support substrate, and a method for producing the same.

2. Description of the Related Art

In recent years, many piezoelectric devices have been developed. In the piezoelectric devices, a piezoelectric thin film is bonded to a support substrate or the like (for example, refer to Japanese Unexamined Patent Application Publication No. 6-326553, Japanese Unexamined Patent Application Publication No. 2004-343359, and Japanese Unexamined Patent Application Publication No. 2005-252550).

Various methods have been proposed and employed as a method of bonding a piezoelectric thin film to a support substrate. For example, in a bonding method referred to as hydrophilic bonding (refer to Japanese Unexamined Patent Application Publication No. 6-326553), first, an inorganic oxide layer is formed on each of the bonding surface of a thin film and the bonding surface of a support substrate, which have been subjected to mirror finishing. Then, a hydroxyl group is formed on the surface of each of the inorganic oxide layers. Then, the surface of the inorganic oxide layer on the thin film side and the surface of the inorganic oxide layer on the support substrate side are overlaid on each other, and thereby, the inorganic oxide layer on the thin film side and the inorganic oxide layer on the support substrate side are bonded together by hydrogen bonding between hydroxyl groups. Then, heat treatment is performed at 200° C. or higher to eliminate $H_2O$ from hydrogen-bonded hydroxyl groups, thus markedly increasing the bonding strength between the inorganic oxide layer on the thin film side and the inorganic oxide layer on the support substrate side.

Furthermore, in a bonding method referred to as activation bonding (refer to Japanese Unexamined Patent Application Publication No. 2004-343359 and Japanese Unexamined Patent Application Publication No. 2005-252550), first, the bonding surface on the thin film side and the bonding surface on the support substrate side, which have been subjected to mirror finishing, are each subjected to sputter etching in an inert gas atmosphere or in vacuum. Thereby, contamination is removed from the surfaces, and the surfaces are activated. In that state, the bonding surface on the thin film side and the bonding surface on the support substrate side are overlaid on each other, and thereby, in a non-heated environment, the bonding surface on the thin film side and the bonding surface on the support substrate side are strongly bonded to each other with an amorphous layer interposed therebetween.

In general, when a piezoelectric body has a resistance lower than a certain value, its characteristics are degraded, and therefore, the piezoelectric body has a relatively large resistivity. Consequently, a large amount of pyroelectric charge is generated by application of heat. For example, the volume resistivity of lithium tantalate, lithium niobate, or the like is high at $10^8$ Ω·m or more. Consequently, unless a structure for releasing the pyroelectric charge from a piezoelectric thin film is provided on the piezoelectric thin film, there may be cases where the electric field due to the pyroelectric charge is stronger than the coercive electric field of the piezoelectric body locally in the plane of the piezoelectric thin film. In a piezoelectric body, in order to obtain sufficient piezoelectricity, spontaneous polarization is necessary. In the case where the electric field due to pyroelectric charge is stronger than the coercive electric field of the piezoelectric body locally, polarization inversion may occur in that region, resulting in a degradation of piezoelectricity of the piezoelectric thin film. Furthermore, the pyroelectric charge may cause electrode breakage to occur in functional electrodes.

Accordingly, in the structures of the piezoelectric devices disclosed in the prior art documents described above, since an insulating layer is disposed between the piezoelectric thin film and the support substrate, the pyroelectric charge is not released, and there is a possibility that the problems due to the pyroelectric charge described above will occur.

In order to prevent the occurrence of the problems due to the pyroelectric charge, it is desirable to provide an electrode structure for releasing pyroelectric charge on a piezoelectric thin film. However, in such a case, since the piezoelectric device has an undesirable electrode structure, the types of device in which such a piezoelectric device can be used are limited. For example, in a radio-frequency device, such as a filter or multiplexer, radio-frequency signals leak through the undesirable electrode structure, resulting in degradation in characteristics. Consequently, it is not possible to provide an electrode structure for releasing pyroelectric charge, and it is difficult to prevent the occurrence of problems due to pyroelectric charge.

SUMMARY OF THE INVENTION

Accordingly, preferred embodiments of the present invention provide a piezoelectric device having a structure that prevents occurrence of defects due to pyroelectric charge without limitations on the types of devices in which the piezoelectric device can be provided, and a method for producing the piezoelectric device.

A piezoelectric device according to a preferred embodiment of the present invention includes a piezoelectric thin film, a functional electrode, a semi-conducting layer, and a support substrate. The functional electrode is disposed on a first principal surface of the piezoelectric thin film and is electro-mechanically coupled to the piezoelectric thin film. The semi-conducting layer is composed of a semiconductor material or a mixture of a metal and an oxide of the metal and is disposed on a second principal surface of the piezoelectric thin film. The support substrate is disposed on the second principal surface of the piezoelectric thin film with the semi-conducting layer therebetween.

In such a configuration, the pyroelectric charge generated when heat is applied is diffused through the semi-conducting layer, and the electric field due to pyroelectric charge does not increase locally in the piezoelectric thin film. This prevents the electric field due to pyroelectric charge from becoming stronger than the coercive electric field of the piezoelectric thin film, and it is possible to prevent occurrence of polarization inversion in the piezoelectric thin film and electrode breakage of the functional electrode. Moreover, by providing the semi-conducting layer, it is not necessary to provide an undesirable electrode structure, and it is possible to prevent degradation in electrical characteristics (device characteristics) due to leakage of electrical signals and the like.

Furthermore, in the piezoelectric device, preferably, the semi-conducting layer has a volume resistivity of about $1 \times 10^{-5}$ (Ω·m) to about $1 \times 10^2$ (Ω·m), for example.

Furthermore, in the piezoelectric device, preferably, the semi-conducting layer is composed of any one of a titanium oxide, a zinc oxide, a zirconia oxide, a chromium oxide, and silicon, which are semiconductor materials, or any one of a mixture of aluminum and an aluminum oxide, a mixture of cobalt and a cobalt oxide, a mixture of copper and a copper oxide, a mixture of chromium and a chromium oxide, a mixture of iron and an iron oxide, a mixture of molybdenum and a molybdenum oxide, a mixture of nickel and a nickel oxide, a mixture of niobium and a niobium oxide, a mixture of titanium and a titanium oxide, a mixture of silicon and a silicon oxide, a mixture of tantalum and a tantalum oxide, a mixture of tungsten and a tungsten oxide, a mixture of zinc and a zinc oxide, and a mixture of zirconium and a zirconium oxide, for example.

Furthermore, in the piezoelectric device, preferably, the semi-conducting layer has a thickness of about 100 nm or less, for example.

In the piezoelectric device, the piezoelectric thin film may be made of a piezoelectric single crystal, and film stress may differ between the first principal surface side and the second principal surface side of the piezoelectric single crystal thin film.

Furthermore, in the piezoelectric device, the piezoelectric single crystal thin film may have a structure in which hydrogen atoms or helium atoms are incorporated as interstitial atoms in the crystal, and the density of interstitial atom distribution differs between the first principal surface side and the second principal surface side.

In these configurations, if the semi-conducting layer is not provided, the amount of pyroelectric charge generated at the time of heat application increases, thus increasing the risk that piezoelectricity will be impaired by the pyroelectric charge, and electrode breakage of the functional electrode will occur. Therefore, it is highly useful to provide the semi-conducting layer.

A method for producing a piezoelectric device according to a preferred embodiment of the present invention includes a laminate formation step, a semi-conducting layer formation step, and a functional electrode formation step. In the laminate formation step, a laminate including a piezoelectric thin film, a support substrate, and a metal layer interposed therebetween is formed. In the semi-conducting layer formation step, a semi-conducting layer is formed by oxidizing the metal layer. In the functional electrode formation step, a functional electrode that is electro-mechanically coupled to the piezoelectric thin film is formed on a first principal surface of the piezoelectric thin film. The semi-conducting layer is a layer composed of a mixture of a metal constituting the metal layer and an oxide thereof, or a layer composed of a semiconductor which is an oxide of a metal constituting the metal layer.

In such a production method, a piezoelectric device provided with a semi-conducting layer can be produced. Therefore, in the piezoelectric device, it is possible to prevent occurrence of polarization inversion due to pyroelectric charge and electrode breakage of the functional electrode due to pyroelectric charge.

Preferably, the method for producing a piezoelectric device further includes an oxide layer formation step in which an oxide layer to be stacked on the metal layer is formed.

In such a production method, the oxide layer serves as an oxygen supply source for the oxidation reaction of the metal layer, and it is possible to markedly reduce the time required for oxidation of the metal layer or the heating temperature when oxidation is performed by heating.

In the method for producing a piezoelectric device, preferably, the laminate formation step is continuously carried out in an inert gas atmosphere or in vacuum.

In such a production method, the surfaces of the metal layer are not oxidized by the outside air or contaminated. Thus, a metal bonded layer can be formed by overlaying clean surfaces on each other. Consequently, strong bonding can be more reliably achieved.

Preferably, the method for producing a piezoelectric device further includes an ion implantation step and a separation step. In the ion implantation step, an ionized element is implanted from a bonding surface of a piezoelectric substrate to form a region of the piezoelectric substrate in which the element is concentrated. In the separation step, a region on the bonding surface side of the piezoelectric substrate is separated by heating to form a piezoelectric thin film.

Furthermore, preferably, the method further includes a temporary support step and a support step. In the temporary support step, a temporary support substrate is provided on the ion implantation surface side of the piezoelectric substrate, the temporary support substrate being composed of the same material as that of the piezoelectric substrate or the temporary support substrate having smaller thermal stress acting on the interface with the piezoelectric substrate than the thermal stress acting on the interface between the support substrate and the piezoelectric substrate. In the support step, a support substrate is provided on the piezoelectric thin film separated from the piezoelectric substrate.

In this production method, the piezoelectric thin film can be formed with a stable thickness and a desired crystal orientation, and the material utilization efficiency of the piezoelectric substrate can be increased. Furthermore, in this production method, the ionized element is incorporated into the crystal lattice of the piezoelectric thin film by ion implantation, and the distribution density thereof is inclined to one principal surface side. As a result, the piezoelectric thin film is slightly warped, which tends to cause difficulty in bonding to the support substrate. However, when the production method according to a preferred embodiment of the present invention is used, the piezoelectric substrate and the support substrate can be bonded to each other in a non-heated environment, without being affected by thermal stress, and therefore, the usefulness is very high. Furthermore, the usefulness due to diffusion of pyroelectric charge by providing the semi-conducting layer is high.

According to various preferred embodiments of the present invention, the pyroelectric charge generated in the piezoelectric thin film when heat is applied to the piezoelectric device is diffused through the semi-conducting layer, and therefore, the electric field due to pyroelectric charge does not increase locally in the piezoelectric thin film. This prevents the electric field due to pyroelectric charge from becoming stronger than the coercive electric field of the piezoelectric thin film, and it is possible to prevent occurrence of polarization inversion in the piezoelectric thin film and electrode breakage of the functional electrode. Moreover, by providing the semi-conducting layer, it is not necessary to provide an undesirable electrode structure, and it is possible to prevent degradation in electrical characteristics (device characteristics) due to leakage of electrical signals and the like.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

First, a piezoelectric device according to a first preferred embodiment of the present invention will be described using, as a specific non-limiting example, a surface acoustic wave (SAW) device.

Figure 1:
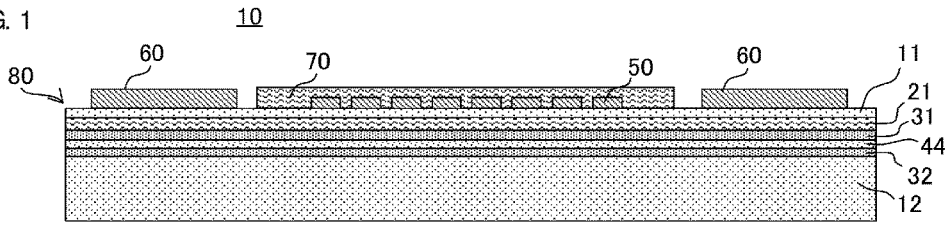
FIG. 1 is a view showing a structure of a piezoelectric device according to a first preferred embodiment of the present invention.

FIG. 1 is a view showing a structure of a SAW device 10 in this preferred embodiment.

The SAW device 10 includes a laminated substrate portion 80, an interdigital transducer (IDT) electrode 50, a protective insulating film 70, and wiring 60. The laminated substrate portion 80 preferably has an overall thickness of about 250 µm, for example, and includes a piezoelectric single crystal thin film 11, a support substrate 12, oxide layers 31 and 32, a semi-conducting layer 44, and a dielectric layer 21.

The support substrate 12 is located at the bottom surface of the laminated substrate portion 80. In this example, the support substrate 12 is composed of an alumina substrate or magnesia substrate. The alumina substrate or magnesia substrate has good thermal conduction and a lower coefficient of linear expansion than that of a piezoelectric single crystal material. By using such a support substrate 12, the SAW device 10 has improved frequency-temperature characteristics, heat-dissipating property, and electric power handling capability.

The oxide layer 32 is stacked on the upper surface of the support substrate 12. The oxide layer 32 is provided to define the semi-conducting layer 44, the detail of which will be described later. In this example, the oxide layer 32 is composed of a silicon oxide film.

The semi-conducting layer 44 is stacked on the upper surface of the oxide layer 32. The semi-conducting layer 44 is provided to diffuse pyroelectric charge generated in the piezoelectric thin film 11 so as to prevent local polarization inversion in the piezoelectric thin film 11 and electrode breakage of the IDT electrode 50. Furthermore, the semi-conducting layer 44 is used to bond the piezoelectric thin film 11 and the support substrate 12 to each other. In this example, the semi-conducting layer 44 is composed of a titanium oxide, which is a semiconductor.

The semi-conducting layer 44 may be composed of, instead of the titanium oxide, any one of a zinc oxide, a zirconia oxide, a chromium oxide, and silicon, which are semiconductor materials, or a mixture of titanium and a titanium oxide, a mixture of aluminum and an aluminum oxide, a mixture of cobalt and a cobalt oxide, a mixture of copper and a copper oxide, a mixture of chromium and a chromium oxide, a mixture of iron and an iron oxide, a mixture of molybdenum and a molybdenum oxide, a mixture of nickel and a nickel oxide, a mixture of niobium and a niobium oxide, a mixture of silicon and a silicon oxide, a mixture of tantalum and a tantalum oxide, a mixture of tungsten and a tungsten oxide, a mixture of zinc and a zinc oxide, a mixture of zirconium and a zirconium oxide, or the like, for example.

The oxide layer 31 is stacked on the upper surface of the semi-conducting layer 44. The oxide layer 31 is provided to define the semi-conducting layer 44, as in the case of the oxide layer 32. In this example, the oxide layer 32 is composed of a silicon oxide film.

The dielectric layer 21 is stacked on the upper surface of the oxide layer 31. The dielectric layer 21 is provided to obtain good characteristics by confining surface acoustic waves in the surface layer of the SAW device 10. The dielectric layer 21 used in this non-limiting example preferably is a laminated film including a silicon oxide film (not shown) with a thickness of about 700 nm and an aluminum nitride film (not shown) with a thickness of about 1,400 nm. Note that the dielectric layer 21 is not an essential constituent, and may be omitted.

The piezoelectric single crystal thin film 11 is stacked on the upper surface of the dielectric layer 21. The piezoelectric single crystal thin film 11 used in this example preferably is a LT (lithium tantalate) single crystal thin film. The material for the piezoelectric single crystal thin film 11 may be appropriately selected from piezoelectric materials, such as LT, LN (LiNbO$_3$), LBO (Li$_2$B$_4$O$_7$), langasite (La$_3$Ga$_5$SiO$_{14}$), and KN (KNbO$_3$), for example. Among these piezoelectric materials, pyroelectric charge is likely to be generated in LT and LN. Therefore, in the case where the piezoelectric single crystal thin film 11 is composed of LT or LN, by providing the semi-conducting layer 44, the effect of preventing defects due to pyroelectric charge increases.

The IDT electrode 50 and the wiring 60 are formed preferably by patterning on the upper surface of the piezoelectric single crystal thin film 11. The IDT electrode 50, which corresponds to a functional electrode in this preferred embodiment, is electro-mechanically coupled to the piezoelectric single crystal thin film 11 and, together with the piezoelectric single crystal thin film 11, constitutes a surface acoustic wave device. The wiring 60 transmits radio-frequency signals between the IDT electrode 50 and an external circuit. The IDT electrode and the wiring 60 used in this example are composed of a laminated film including aluminum and titanium. As the aluminum film, an alloy mainly containing aluminum, such as an Al—Cu alloy, may be used.

In the SAW device 10 having such a structure, the coercive electric field of the piezoelectric single crystal thin film 11 (in this example, LT single crystal with a thickness of 500 nm) preferably is about 20 kV/mm to about 30 kV/mm, for example. Consequently, in the case where the polarization axis of the piezoelectric single crystal thin film 11 is directed normal to the principal surface of the piezoelectric single crystal thin film 11, when an electric field by a voltage of 10 to 15 V is applied between two principal surfaces of the piezoelectric single crystal thin film 11, the electric field is stronger than the coercive electric field of the piezoelectric single crystal thin film 11, resulting in occurrence of polarization inversion. Furthermore, in the case where the polarization axis of the piezoelectric single crystal thin film 11 is inclined from the direction normal to the principal surface of the piezoelectric single crystal thin film 11, the electric field which leads to polarization inversion increases. For example, in the case where the polarization axis is inclined at about 45° from the direction normal to the principal surface of the piezoelectric single crystal thin film 11, an electric field by a voltage of about 14.1 V to about 21.2 V is required.

If the pyroelectric charge generated in the piezoelectric single crystal thin film 11 is not diffused by the semi-conducting layer 44, the voltage of a dozen or so volts is a voltage level at which polarization inversion easily occurs. Consequently, by diffusing the pyroelectric charge, which is generated in the piezoelectric single crystal thin film 11, by the semi-conducting layer 44, concentration of the electric field due to the pyroelectric charge can be prevented, and it is possible to prevent the occurrence of polarization inversion regions and electrode breakage of the IDT electrode 50. Specifically, at a thickness of the semi-conducting layer 44 in a range of about 0.1 nm to about 100 nm, when the resistivity is about $1 \times 10^2$ ($\Omega \cdot m$) or less, for example, polarization inversion hardly occurs in the piezoelectric single crystal thin film 11. This will be shown below.

An experiment was performed on a plurality of piezoelectric substrates on which semi-conducting layers having different volume resistivities were formed, in which a region of 1 mm×1 mm was considered as one cell, and the number of cells in which polarization inversion was caused by application of heat at 250° C. was checked. The following experimental results were obtained.

TABLE 1

| Volume resistivity of semi-conducting layer ($\Omega \cdot m$) | Incidence of polarization inversion (%) |
| --- | --- |
| $1 \times 10^{-2}$ | 0 |
| $1 \times 10^{-1}$ | 0 |
| $1 \times 10^{0}$ | 0 |
| $1 \times 10^{1}$ | 0 |
| $1 \times 10^{2}$ | 0 |
| $1 \times 10^{3}$ | 69.2 |
| $1 \times 10^{4}$ | 98.9 |

As is evident from the experimental results, in the piezoelectric substrates in which a semi-conducting layer with a volume resistivity of about $1 \times 10^2$ ($\Omega \cdot m$) or less (operating temperature range of elastic wave device and a thickness of semi-conducting layer of about 1 nm, is formed, the incidence of polarization inversion is reduced.

Furthermore, if radio-frequency signals flowing through the IDT electrode 50 and the wiring 60 leak into the semi-conducting layer 44, device characteristics will be degraded. However, by setting the resistivity of the semi-conducting layer 44 at a moderate level, leakage of radio-frequency signals into the semi-conducting layer 44 can be prevented. Specifically, in a non-limiting example where the bandwidth at which the device is used is within a range of about 300 MHz to about 2.7 GHz, at a thickness of the semi-conducting layer 44 in a range of about 0.1 nm to about 100 nm, when the resistivity is about $1 \times 10^{-5}$ ($\Omega \cdot m$) or more, degradation of device characteristics (impedance ratio) can be significantly reduced to several percent or less.

As described above, by disposing the semi-conducting layer 44 with a thickness of 1 nm and a volume resistivity of about $1 \times 10^{-5}$ ($\Omega \cdot m$) to about $1 \times 10^2$ ($\Omega \cdot m$) between the piezoelectric thin film 11 and the support substrate 12, polarization inversion of the piezoelectric thin film 11 due to pyroelectric charge can be significantly reduced without degrading device characteristics.

In this preferred embodiment, the oxide layer 31 and the dielectric layer 21 preferably are interposed between the piezoelectric single crystal thin film 11 and the semi-conducting layer 44. The insulating layers, such as the oxide layer 31 and the dielectric layer 21, decrease the emission rate of pyroelectric charge between the piezoelectric single crystal thin film 11 and the semi-conducting layer 44 and decrease the effect of significantly reducing polarization inversion. However, when the thickness of the insulating layers is very small at several micrometers or less, this hardly prevents diffusion of pyroelectric charge.

Aluminum nitride (volume resistivity: $1 \times 10^{11}$ $\Omega \cdot m$) serving as an insulator layer was interposed between a piezoelectric film and a semi-conducting layer, and it was checked whether or not the effect of significantly reducing polarization inversion was impaired by this. A region of about 1 mm×1 mm was considered as one cell in a piezoelectric substrate of 0100 mm, and the ratio of cells in which polarization inversion was caused by application of heat at 250° C. was checked. The following experimental results were obtained.

TABLE 2

| Thickness of aluminum nitride (nm) | Number of cells in which polarization inversion occurred when φ100 mm substrate was divided into 1 mm × 1 mm cells (7,853 cells) | Ratio of cells in which polarization inversion occurred (%) |
| --- | --- | --- |
| None | 0 | 0.0 |
| 100 | 0 | 0.0 |
| 500 | 0 | 0.0 |
| 1,000 | 115 | 1.5 |
| 2,000 | 211 | 2.7 |
| 5,000 | 5025 | 64.0 |
| 10,000 | 7516 | 97.6 |
| 100,000 | 7651 | 99.4 |
| Reference Without semiconductor layer | 7635 | 99.2 |

As shown in the experimental results, when the thickness of the aluminum nitride (insulator) is about 2,000 nm (about 200 kΩ in terms of resistance) or less, a sufficient suppressing effect is observed. Even when the thickness is about 5,000 nm (about 500 kΩ in terms of resistance) or less, although the effect decreases, the effect of suppressing polarization inversion is high compared with the case without the semi-conducting layer. On the other hand, when the thickness is about 10,000 nm (about 1,000 kΩ) or more, the effect is hardly observed. Consequently, it is confirmed that when the insulator layer has a certain thickness or less, the effect of suppressing the adverse effect of pyroelectric charge in the structure of a preferred embodiment of the present invention can be retained.

In conventional piezoelectric devices, by decreasing the resistivity of the piezoelectric body, generation of pyroelectric charge may be prevented in some cases. In such cases, it is necessary to prevent an increase in resistivity due to oxidation of the piezoelectric body, and the piezoelectric device needs to be housed in an internal space of an airtight package in which inert gas is enclosed. Therefore, the conventional devices incur an additional package cost, and it is difficult to achieve a low profile of the package. In contrast, in the piezoelectric device having the structure shown in the present preferred embodiment of the present invention, regardless of the resistivity of the piezoelectric body, pyroelectric charge can be reliably diffused by the semi-conducting layer 44. Therefore, it is not necessary to house the piezoelectric device in an airtight package in which inert gas is enclosed, the package cost can be reduced, and a low profile of the package can be achieved easily.

A non-limiting example of a method for producing a SAW device 10 will now be described.

Figure 2:
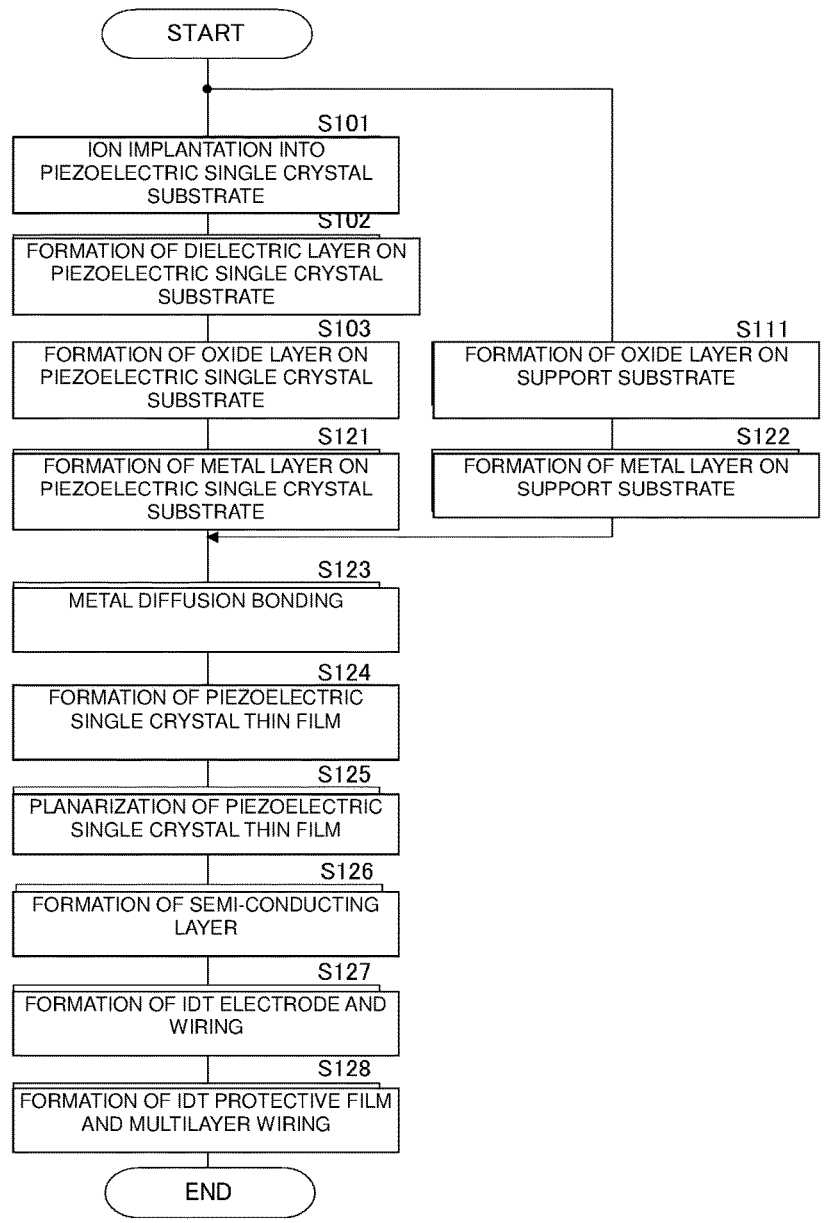
FIG. 2 is a flowchart showing a production flow in a method for producing a piezoelectric device according to the first preferred embodiment of the present invention.
Figure 3:
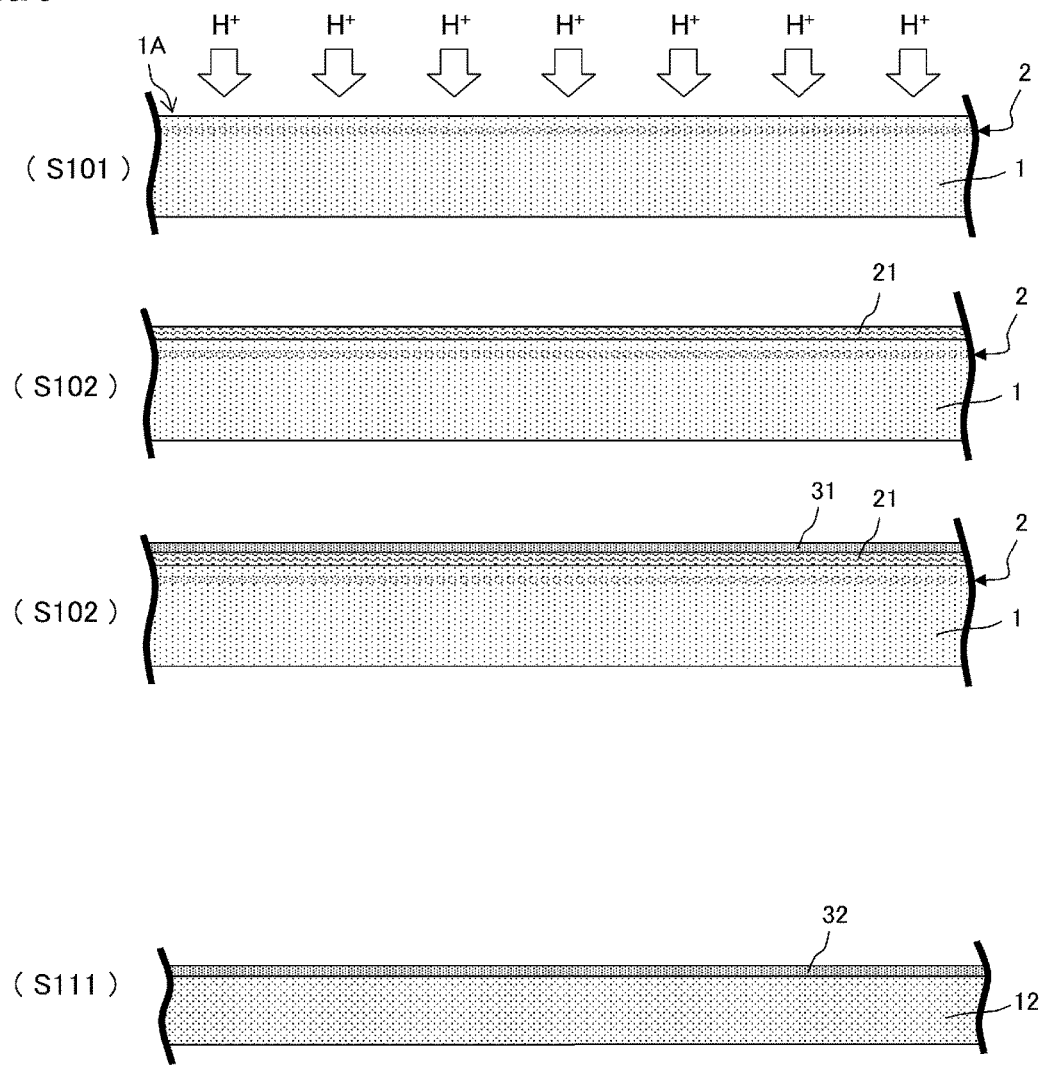
FIG. 3 includes schematic views showing the steps in the production flow shown in FIG. 2.
Figure 4:
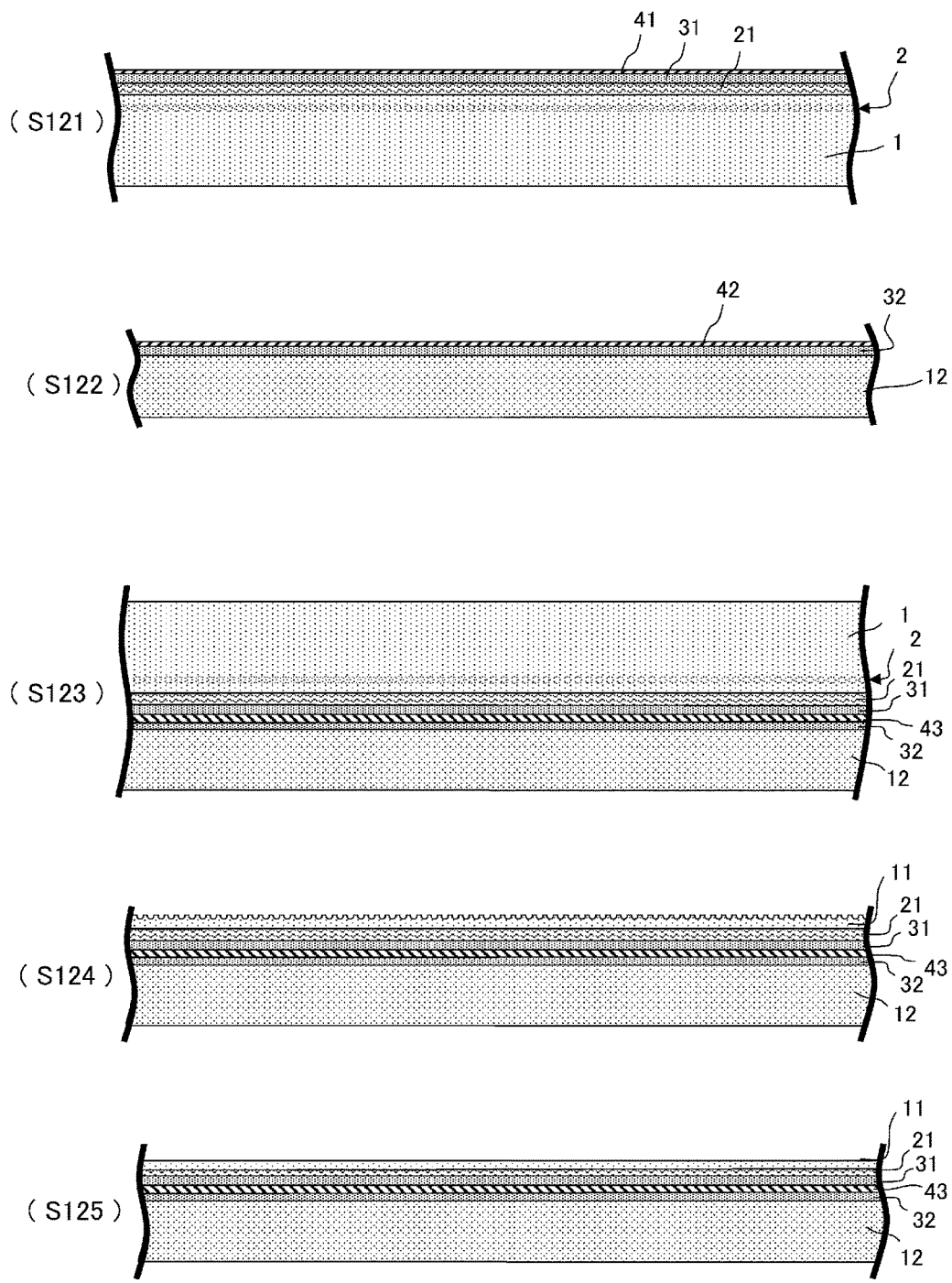
FIG. 4 includes schematic views showing the steps in the production flow shown in FIG. 2.

FIG. 2 is a flowchart showing a production flow of a SAW device according to this preferred embodiment. FIGS. 3 and 4 include schematic views showing the steps in the production flow.

First, a piezoelectric single crystal substrate 1 is prepared, and ions are implanted from a principal surface 1A (bonding surface 1A) side of the piezoelectric single crystal substrate 1 for separating a piezoelectric single crystal thin film 11 (reference sign not shown) later (S101). This step corresponds to an ion implantation step in this preferred embodiment. As a result, as shown in FIG. 3 (S101), a defective layer 2 is formed at a predetermined depth from the bonding surface 1A of the piezoelectric single crystal substrate 1. The defective layer 2 is a region in which ionized atoms implanted into the piezoelectric single crystal substrate 1 are concentrated.

More specifically, the ions used in this example are hydrogen ions. Hydrogen ions are implanted into the piezoelectric single crystal substrate 1 at an accelerating voltage of 80 KeV and a dose of $1.0 \times 10^{17}$ atom/cm². As a result, the defective layer 2 is formed at a depth of about 550 nm from the bonding surface 1A. The defective layer 2 formation position is determined by the accelerating voltage during ion implantation. For example, when the defective layer 2 is formed at about half the depth, the accelerating voltage may be decreased to about a half. Besides hydrogen ions, the ions to be implanted may be appropriately selected from helium ions, argon ions, and the like.

Next, as shown in FIG. 3 (S102), a dielectric layer 21 is formed on the bonding surface 1A of the piezoelectric single crystal substrate 1 (S102).

Next, as shown in FIG. 3 (S103), an oxide layer 31 composed of silicon oxide is formed on the surface of the dielectric layer 21 (S103). The surface of the oxide layer 31 is preferably planarized by a chemical mechanical polishing (CMP) method or the like. Note that the oxide layer 31 may be composed of a material other than silicon oxide as long as it serves as an oxygen supply source for a metal bonded layer 43 (reference sign not shown) later. Furthermore, the thickness thereof may be appropriately adjusted depending on the type and thickness of the metal bonded layer 43 (reference sign not shown).

Furthermore, as shown in FIG. 3 (S111), a support substrate 12 is prepared, and an oxide layer 32 composed of silicon oxide is formed on the surface of the support substrate (S111). The surface of the oxide layer 32 is preferably planarized by a CMP method or the like. As in the case of the oxide layer 31, the oxide layer 32 may be composed of a material other than silicon oxide as long as it serves as an oxygen supply source for the metal bonded layer 43 (reference sign not shown) later. Furthermore, the thickness thereof may be appropriately adjusted depending on the type and thickness of the metal bonded layer 43 (reference sign not shown).

The steps of forming the oxide layers 31 and 32 correspond to an oxide layer formation step in this preferred embodiment. A structure may be used in which either one of the oxide layers 31 and 32 is provided. However, by providing oxide layers on both the support substrate 12 side and the piezoelectric single crystal substrate 1 side, subsequent oxidation of the metal bonded layer 43 (reference sign not shown) can be performed at a lower temperature and for a shorter period of time.

Next, as shown in FIG. 4 (S121), a very thin metal layer 41 is formed by sputtering on the surface of the oxide layer 31 on the piezoelectric single crystal substrate 1 side (S121). This step corresponds to a first metal layer formation step in this preferred embodiment. The metal layer 41 used in this example preferably is a titanium thin film with a thickness of about 1 nm or less.

Furthermore, as shown in FIG. 4 (S122), a very thin metal layer 42 is formed by sputtering on the surface of the oxide layer 32 on the support substrate 12 side (S122). This step corresponds to a second metal formation step in this preferred embodiment. The metal layer 42 is also a titanium thin film with a thickness of 1 nm or less.

Instead of titanium, the metal layers 41 and 42 may be composed of aluminum, cobalt, copper, chromium, iron, molybdenum, nickel, niobium, |[h1] silicon, tantalum, tungsten, zinc, zirconium, or the like, for example.

Next, as shown in FIG. 4 (S123), by overlaying the metal layer 42 (reference sign not shown) on the support substrate 12 side and the metal layer 41 (reference sign not shown) on the piezoelectric single crystal substrate 1 side on each other, a metal bonded layer 43 with a thickness of about 2 nm or less is formed (S123). This step corresponds to a metal layer bonding step in this preferred embodiment. Note that all the steps described above including this one correspond to a laminate formation step in this preferred embodiment.

The steps of forming the metal layers 41 and 42 and the step of forming the metal bonded layer 43 are continuously carried out in a high vacuum of about $10^{-6}$ Pa or less, for example. As a result, the metal layers 41 and 42 are strongly bonded to each other to form a single crystalline body, and thus the metal bonded layer 43 is formed.

Therefore, strong bonding can be achieved simply by bonding together the piezoelectric single crystal substrate 1 and the support substrate 12 in a non-heated environment. Even when the piezoelectric single crystal substrate 1 and the support substrate 12 have largely different coefficients of linear expansion, stress due to the difference in coefficient of linear expansion does not remain in the metal bonded layer 43.

The metal layers 41 and 42 constituting the metal bonded layer 43 are preferably composed of the same metal material. The reason for this is that, in the case of different metal materials, bonding strength may be decreased by segregation, or voids may be produced in the bonded metal portion, because of a difference in diffusion rate during heating.

Furthermore, the metal layers 41 and 42 are preferably composed of a metal material having a high diffusion coefficient (diffusion rate). The reason for this is that, in the metal material having a high diffusion coefficient, it is possible to increase the margin regarding the flatness of the bonding surface. Furthermore, the metal layers 41 and 42 are preferably composed of a metal material which has a negative free energy of oxide formation and is likely to be oxidized. Furthermore, the metal layers 41 and 42 are preferably composed of a metal material in which the electrical conductivity decreases sufficiently when transformed into an oxide. These conditions can be satisfied by any of aluminum, cobalt, copper, chromium, iron, molybdenum, nickel, niobium, silicon, tantalum, tungsten, zinc, zirconium, and titanium, which are described above.

Next, the laminate in which the support substrate 12 and the piezoelectric single crystal substrate 1 are strongly bonded to each other with the metal bonded layer 43 interposed therebetween is placed in a heated environment at about 250° C. (S124), for example. Thereupon, as shown in FIG. 4 (S124), the piezoelectric single crystal substrate 1 (reference sign not shown) is separated at the defective layer 2 (reference sign not shown), and a piezoelectric single crystal thin film 11 is formed. This step corresponds to a separation step in this preferred embodiment.

As described above, by separating the piezoelectric single crystal thin film 11 using ion implantation and heat treatment, a piezoelectric single crystal thin film 11 with a very small thickness, in which good thickness distribution is maintained, can be easily produced. Furthermore, since the crystal orientation of the piezoelectric single crystal substrate can be set arbitrarily, by forming the piezoelectric single crystal thin film 11 using ion implantation into the piezoelectric single crystal substrate 1, the crystal orientation of the piezoelectric single crystal thin film 11 can also be set arbitrarily. Thereby, the piezoelectric single crystal thin film 11 having a desirable crystal orientation is obtained for a SAW device, and the piezoelectricity of the SAW device can be improved.

Next, as shown in FIG. 4 (S125), the surface of the piezoelectric single crystal thin film 11 is planarized by a CMP method or the like (S125). In this example, the surface is planarized by polishing off the piezoelectric single crystal thin film 11 by about 50 nm, for example.

Figure 5:
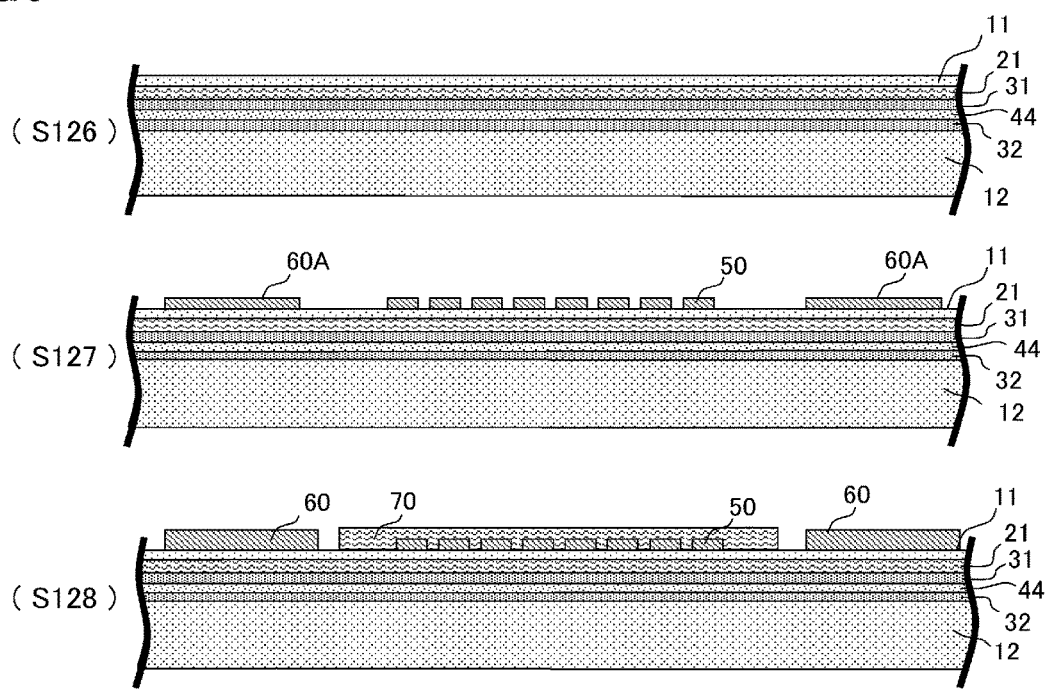
FIG. 5 includes schematic views showing the steps in the production flow shown in FIG. 2.

Next, as shown in FIG. 5 (S126), the metal bonded layer (reference sign not shown) is oxidized by heating to form a semi-conducting layer 44 (S126). This step corresponds to a semi-conducting layer formation step in this preferred embodiment. Since the oxide layers 31 and 32 are in contact with the metal bonded layer 43 (reference sign not shown), oxygen used in the oxidation reaction is supplied from the oxide layers 31 and 32. In this example, since the metal bonded layer 43 (reference sign not shown) is composed of titanium, the semi-conducting layer 44 is composed of a titanium oxide, which is a semiconductor material, or a mixture of titanium and a titanium oxide. Therefore, the semi-conducting layer 44 does not affect the device characteristics and can diffuse the pyroelectric charge. Since the semi-conducting layer 44 is formed by diffusion of the metal bonded layer 43 due to heating, the thickness of the semi-conducting layer 44 becomes larger than that of the metal bonded layer. Specifically, as described above, the thickness of the semi-conducting layer 44 is about 100 nm or less, for example.

In this step, the heating temperature and the heating time may be selected appropriately depending on the material and thickness of the metal bonded layer 43. For example, in the case where the metal bonded layer 43 is a titanium thin film with a thickness of about 1 nm, at a heating temperature of about 300° C. and a heating time of about one hour, the semi-conducting layer 44 can be sufficiently oxidized to a titanium oxide, which is a semiconductor material.

In the case where the metal bonded layer 43 is composed of a metal material that is transformed into an insulator by oxidation, the semi-conducting layer 44 can be formed by stopping oxidation of the metal bonded layer 43 in a state in which the metal before being completely oxidized remains.

In this preferred embodiment, oxidation of the semi-conducting layer 44 is performed in a heat treatment step which is different from the heat treatment for separation of the piezoelectric single crystal thin film 11. However, by adjusting the heating temperature and heating time during the separation of the piezoelectric single crystal thin film 11, the semi-conducting layer 44 may be oxidized in the same process. Furthermore, the heat treatment step for oxidizing the semi-conducting layer 44 may be carried out before the step of planarizing the surface of the piezoelectric single crystal thin film 11.

Next, as shown in FIG. 5 (S127), an IDT electrode 50 and a wiring pattern 60A required for operation of the SAW device are formed on the surface of the piezoelectric thin film 11. This step corresponds to a functional electrode formation step in this preferred embodiment.

Lastly, as shown in FIG. 5 (S128), by forming the wiring pattern 60A into a two-layered structure, wiring 60 having low resistance is formed. The IDT electrode 50 is covered with an insulating protective film 70, and singulation is performed. As a result, a SAW device is produced.

In the method for producing a SAW device described above, since bonding strength between the piezoelectric single crystal substrate 1 and the support substrate 12 is achieved in a non-heated environment, heating is not required for bonding strength to be exhibited. Even when there is a large difference in coefficient of linear expansion between the piezoelectric single crystal substrate 1 and the support substrate 12, various problems are unlikely to occur during bonding. In particular, in this preferred embodiment, since the piezoelectric single crystal thin film 11 is formed by ion implantation, ionized atoms are incorporated into the crystal of the piezoelectric single crystal thin film 11, and the distribution density thereof is inclined in the thickness direction of the piezoelectric single crystal thin film 11. As a result, the piezoelectric single crystal thin film 11 has film stress. Consequently, supposing that thermal stress is generated during bonding, the summation of film stress and thermal stress would cause the piezoelectric single crystal thin film 11 (piezoelectric single crystal substrate 1) to be easily detached from the support substrate 12, and thus it would be difficult to achieve strong bonding stably. According to the method of this preferred embodiment, strong bonding is exhibited from the moment bonding is performed in a non-heated environment. Since there is no influence of thermal stress during bonding, the method is very effective for achieving strong bonding reliably.

Moreover, if the electrical conductivity of the metal bonded layer 43 is high, SAW device characteristics are adversely affected. However, after bonding, by causing the metal bonded layer 43 to transform into a semi-conducting body 44 having low electrical conductivity, good SAW device characteristics can be obtained.

Furthermore, there is a possibility that pyroelectric charge generated in the piezoelectric single crystal thin film 11 will degrade piezoelectricity and cause electrode breakage of the IDT electrode 50. However, these problems can be prevented by providing the semi-conducting body 44 so that the pyroelectric charge is diffused.

Second Preferred Embodiment

A method for producing a piezoelectric device according to a second preferred embodiment of the present invention will be described using, as a specific example, a method for producing a SAW device.

In this preferred embodiment, a non-limiting example of a production method will be described, in which in order to recover the piezoelectricity and crystallinity of a piezoelectric single crystal thin film, which have been degraded to a certain degree by ion implantation, the piezoelectric single crystal thin film is subjected to high-temperature heat treatment at about 500° C., and thermal deformation due to a difference in coefficient of linear expansion between the support substrate and the piezoelectric single crystal thin film during this process is avoided.

Figure 6:
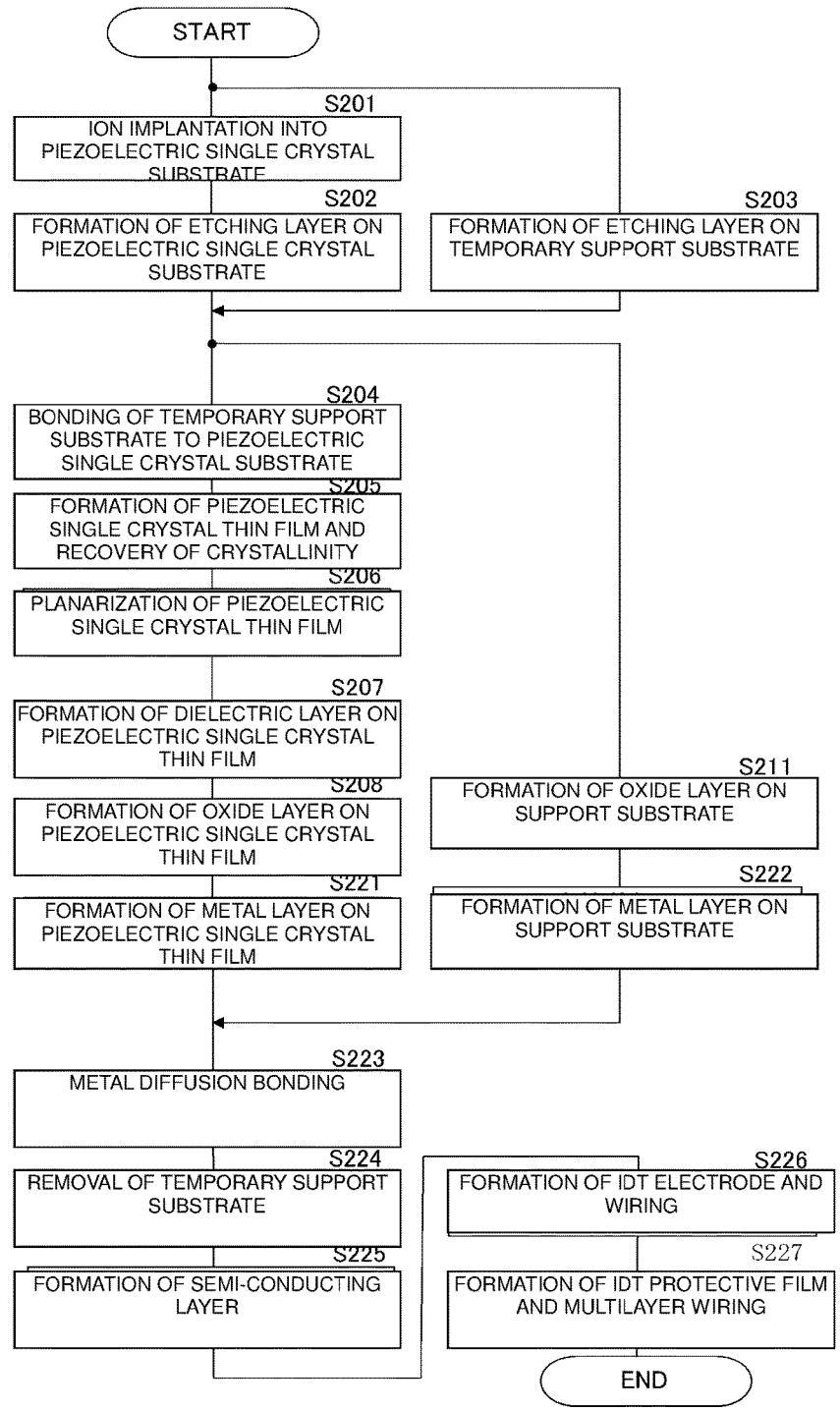
FIG. 6 is a flowchart showing a production flow in a method for producing a piezoelectric device according to a second preferred embodiment of the present invention.

FIG. 6 is a flowchart showing a production flow of a SAW device according to this preferred embodiment.

Figure 7:
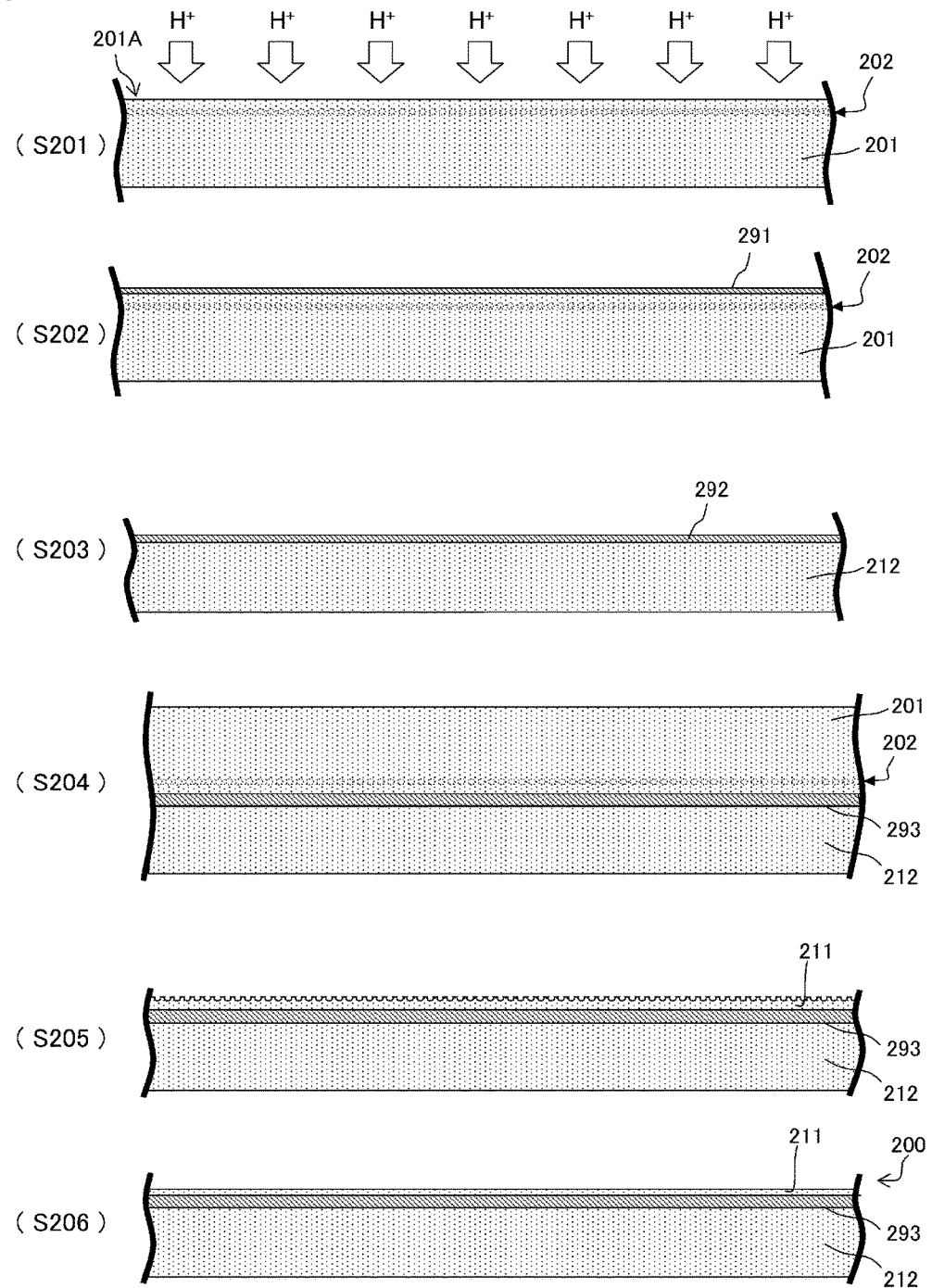
FIG. 7 includes schematic views showing the steps in the production flow shown in FIG. 6.
Figure 8:
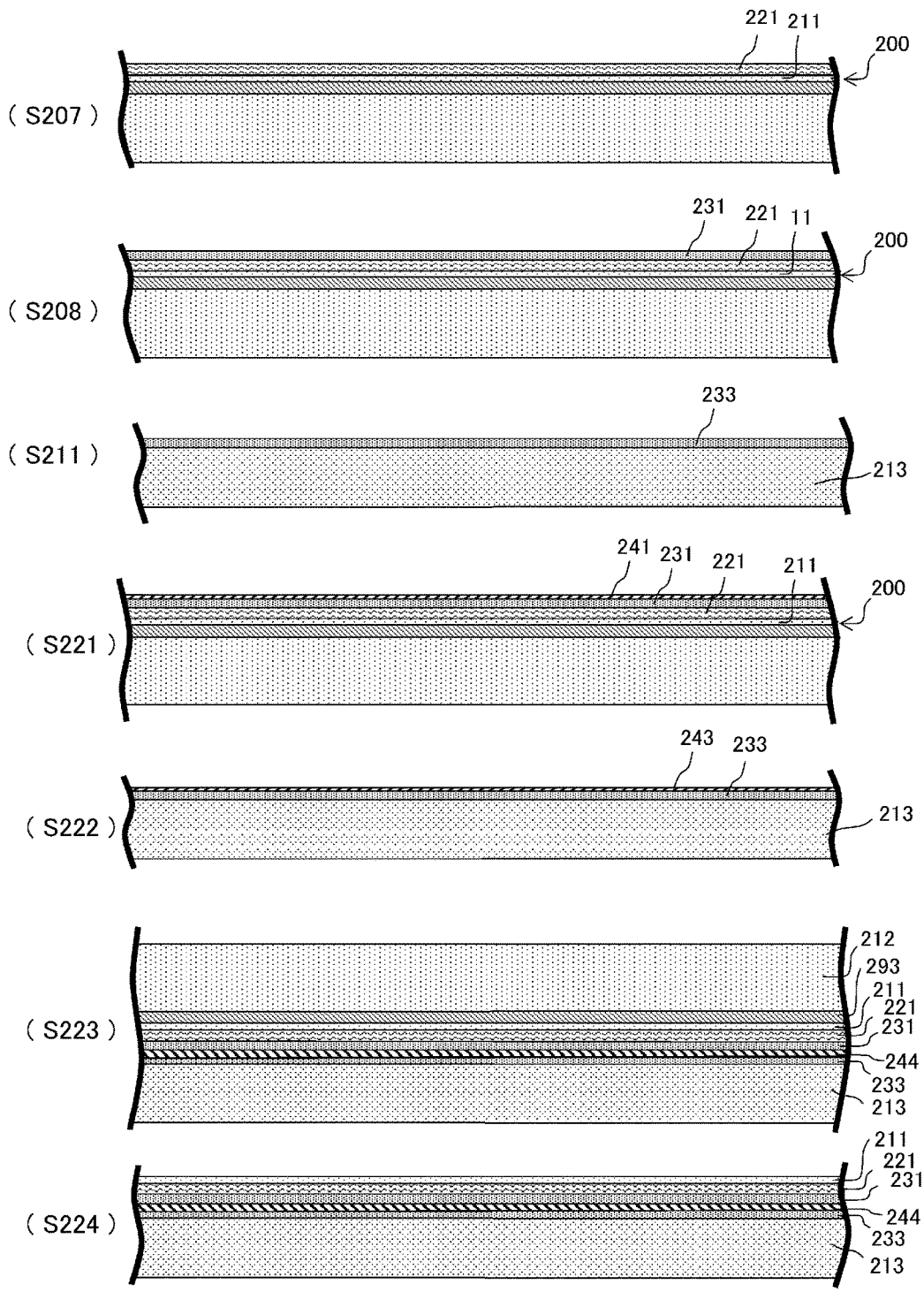
FIG. 8 includes schematic views showing the steps in the production flow shown in FIG. 6.
Figure 9:
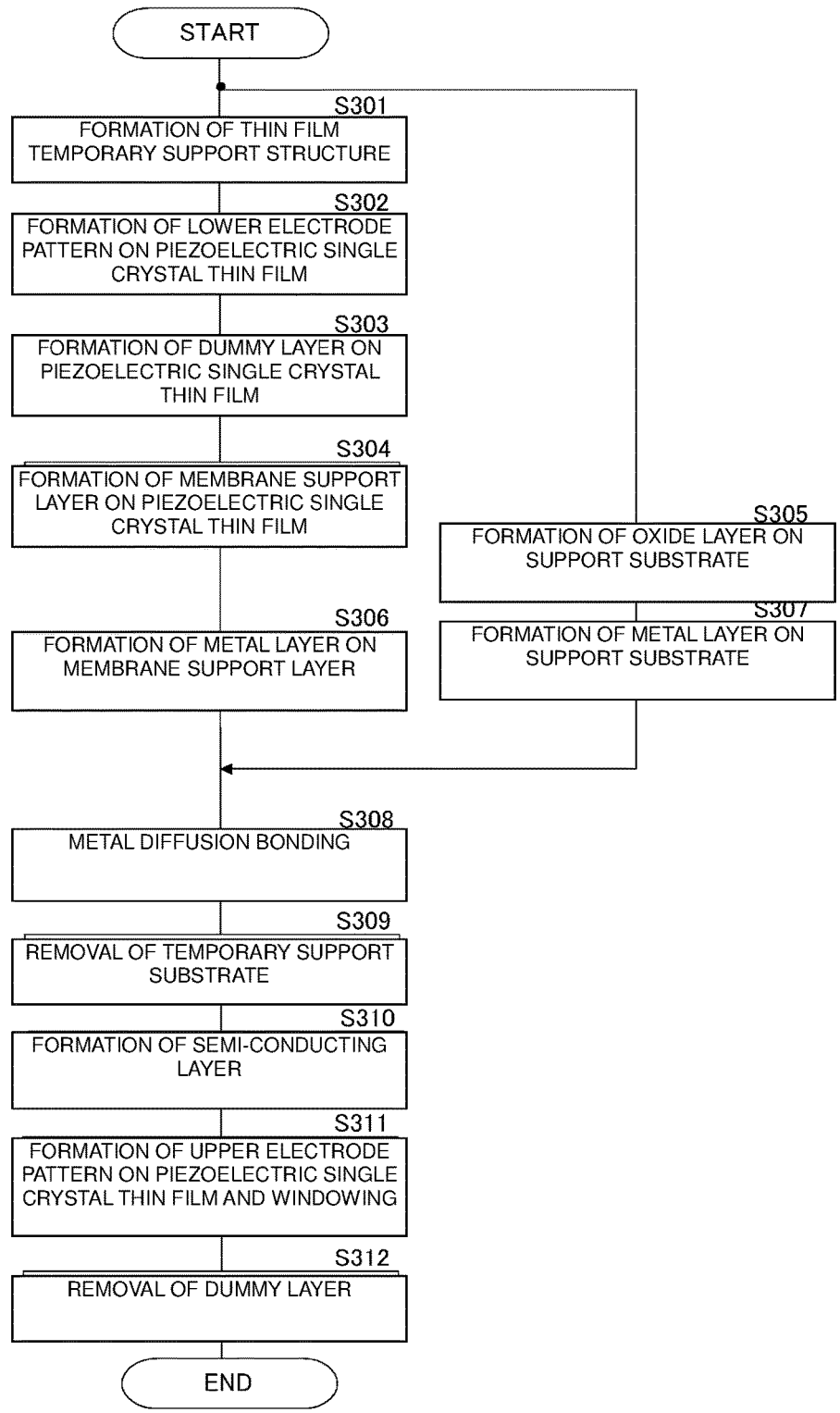
FIG. 9 is a flowchart showing a production flow in a method for producing a piezoelectric device according to a third preferred embodiment of the present invention.

FIGS. 7 and 8 include schematic views showing the steps in the first half of the production flow.

First, a piezoelectric single crystal substrate 201 is prepared, and ions are implanted from a principal surface 201A (bonding surface 201A) side of the piezoelectric single crystal substrate 201. As a result, as shown in FIG. 7 (S201), a defective layer 202 is formed at a predetermined depth from the bonding surface 201A of the piezoelectric single crystal substrate 201.

Next, as shown in FIG. 7 (S202), an etching layer 291 is formed on the bonding surface 201A of the piezoelectric single crystal substrate 201. The surface of the etching layer 291 is preferably planarized by a CMP method or the like. The etching layer 291 is subsequently removed by etching. The etching layer 291 used in this example preferably is a Cu film with a thickness of about 3 μm.

Furthermore, as shown in FIG. 7 (S203), a temporary support substrate 212 is prepared, and an etching layer 292 is also formed on the surface of the temporary support substrate 212. The surface of the etching layer 292 is preferably planarized by a CMP method or the like. The temporary support substrate 212 used in this example is composed of the same material as that of the piezoelectric single crystal substrate 201. Since high-temperature heat treatment for a piezoelectric single crystal thin film 211 (reference sign not shown) is carried out later in a state of being bonded to such a temporary support substrate, it is possible to prevent the occurrence of wafer cracks or the like due to heat treatment. The temporary support substrate 212 may be composed of another material having a coefficient of linear expansion close to that of the piezoelectric single crystal thin film 211 (reference sign not shown). The etching layer 292 used in this example preferably is a Cu film with a thickness of about 3 μm.

Next, as shown in FIG. 7 (S204), the etching layer 292 (reference sign not shown) and the etching layer 291 (reference sign not shown) are bonded to each other, and thus a bonded etching layer 293 is formed. In this step, any bonding method may be used as long as a certain degree of bonding strength can be achieved. Since the temporary support substrate 212 and the piezoelectric single crystal substrate 201 have the same coefficient of linear expansion, a method requiring heating may be used.

Next, the laminate in which the temporary support substrate 212 and the piezoelectric single crystal substrate 201 are bonded to each other with the bonded etching layer 293 interposed therebetween is placed in a heated environment at about 250° C., for example. Thereupon, as shown in FIG. 7 (S205), the piezoelectric single crystal substrate 201 (reference sign not shown) is separated at the defective layer 202 (reference sign not shown), and a piezoelectric single crystal thin film 211 is formed. Subsequently, the laminate in which the temporary support substrate 212 and the piezoelectric single crystal thin film 211 are bonded to each other with the bonded etching layer 293 interposed therebetween is placed in a high-temperature environment at about 500° C., for example. Thereupon, the crystallinity of the piezoelectric single crystal thin film 211 degraded by ion implantation is recovered. Since the temporary support substrate 212 and the piezoelectric single crystal substrate 201 (reference sign not shown) are composed of the same material and have the same coefficient of linear expansion, deformation is hardly caused by these heat treatments, and the piezoelectric single crystal substrate 201 is prevented from being damaged.

Next, as shown in FIG. 7 (S206), the surface of the piezoelectric single crystal thin film 211 is planarized by a CMP method or the like.

By undergoing the steps described above, a thin film temporary support structure 200 in which the piezoelectric single crystal thin film 211 is bonded to the temporary support substrate 212 with the bonded etching layer 293 interposed therebetween is obtained.

Next, as shown in FIG. 8 (S207), a dielectric layer 221 is formed on the surface of the piezoelectric single crystal thin film 211 in the thin film temporary support structure 200.

Next, as shown in FIG. 8 (S208), an oxide layer 231 is formed on the surface of the dielectric layer 221 in the thin film temporary support structure 200.

Furthermore, as shown in FIG. 8 (S211), a support substrate 213 is prepared, and an oxide layer 233 is formed on the surface of the support substrate 213.

Next, as shown in FIG. 8 (S221), a very thin metal layer 241 is formed on the surface of the oxide layer 231 in the thin film temporary support structure 200.

Furthermore, as shown in FIG. 8 (S222), a very thin metal layer 243 is formed on the surface of the oxide layer 233 on the support substrate 213 side.

Next, as shown in FIG. 8 (S223), by overlaying the metal layer 243 (reference sign not shown) on the support substrate 213 side and the metal layer 241 (reference sign not shown) on the thin film temporary support structure 200 side on each other, a metal bonded layer 244 is formed. The steps of forming the metal layers 241 and 243 and the bonding step are continuously carried out in a high vacuum. As a result, bonding between the metal layers 241 and 243 is achieved.

Next, the laminate in which the piezoelectric single crystal thin film 211, the temporary support substrate 212, and the support substrate 213 are bonded together is immersed in an etching solution, such as nitric acid. As a result, the bonded etching layer 293 is etched, and the bonded etching layer 293 and the temporary support substrate 212 are removed. Thus, as shown in FIG. 8 (S224), a structure in which the piezoelectric single crystal thin film 211 and the support substrate 213 are bonded to each other with the metal bonded layer 244 interposed therebetween is obtained.

Subsequently, as in the first preferred embodiment (refer to FIG. 5), a semi-conducting layer (not shown) is formed by oxidation of the metal bonded layer 244, an IDT electrode and an insulating protective film are formed, and singulation is performed to thereby produce a SAW device (S225→S226→S227).

In the second preferred embodiment, since the temporary support substrate, which has substantially no thermal stress acting on the interface with the piezoelectric substrate or in which the thermal stress acting on the interface with the piezoelectric substrate is smaller than the thermal stress acting on the interface between the support substrate and the piezoelectric substrate, is formed on the ion-implanting surface side of the piezoelectric substrate, occurrence of problems in the piezoelectric thin film due to heating can be suppressed compared with conventional cases. Furthermore, when a piezoelectric device according to a preferred embodiment of the present invention is produced using a piezoelectric single crystal material, problems can be further suppressed. Since the support substrate is provided on the piezoelectric thin film after heating, it is not necessary to take into consideration thermal stress acting on the interface with the piezoelectric thin film due to heating, and a constituent material having any coefficient of linear expansion can be selected.

Consequently, it is possible to enhance selectivity in combining the constituent material of the piezoelectric thin film and the constituent material of the support substrate. For example, in a device used as a filter, by setting the coefficient of linear expansion of the constituent material of the support substrate to be considerably smaller than the coefficient of linear expansion of the piezoelectric thin film, the temperature-frequency characteristics of the filter can be improved. Furthermore, it is possible to improve a heat-dissipating property and electric power handling capability by selecting a constituent material having a high thermal conductivity for the support substrate. By selecting inexpensive constituent materials, the device production cost can be reduced.

Third Preferred Embodiment

A piezoelectric device according to a third preferred embodiment of the present invention will be described using, as a specific example, a method for producing a bulk acoustic wave (BAW) device in which a piezoelectric single crystal thin film is supported by a membrane structure.

Figure 10:
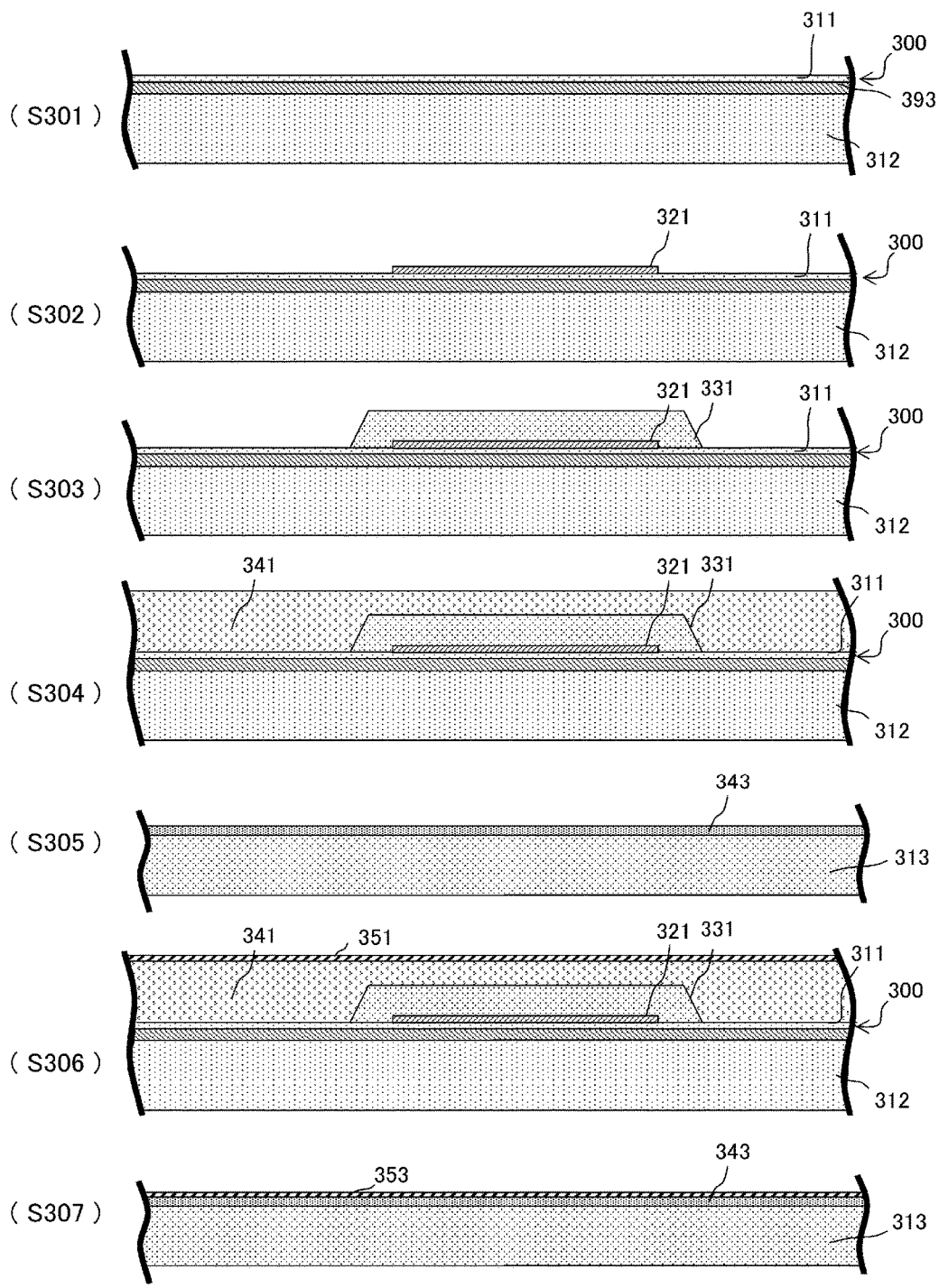
FIG. 10 includes schematic views showing the steps in the production flow shown in FIG. 9.

In this preferred embodiment, first, as in the second preferred embodiment, as shown in FIG. 10 (S301), a thin film temporary support structure 300 is formed, in which a piezoelectric single crystal thin film 311 is bonded to a temporary support substrate 312 with a bonded etching layer 393 interposed therebetween.

Next, as shown in FIG. 10 (S302), a lower electrode pattern 321 to drive a BAW device is formed on the surface of the piezoelectric single crystal thin film 311 in the thin film temporary support structure 300.

Next, as shown in FIG. 10 (S303), a dummy layer pattern 331 that forms a void portion of the membrane structure is formed so as to cover the lower electrode pattern 321 on the surface of the piezoelectric single crystal thin film 311 in the thin film temporary support structure 300.

Next, as shown in FIG. 10 (S304), a membrane support layer 341 is formed so as to cover the dummy layer pattern 331 on the surface of the piezoelectric single crystal thin film 311 in the thin film temporary support structure 300. The membrane support layer 341 is formed by sputtering, and then the surface thereof is planarized by CMP. The membrane support layer 341 used in this example is a silicon oxide film and is later used as an oxide layer.

Furthermore, as shown in FIG. 10 (S305), a support substrate 313 is prepared, and an oxide layer 343 is formed on the surface of the support substrate 313.

Next, as shown in FIG. 10 (S306), a very thin metal layer 351 is formed on the surface of the membrane support layer 341 in the thin film temporary support structure 300.

Furthermore, as shown in FIG. 10 (S307), a very thin metal layer 353 is formed on the surface of the oxide layer 343 on the support substrate 313 side.

Figure 11:
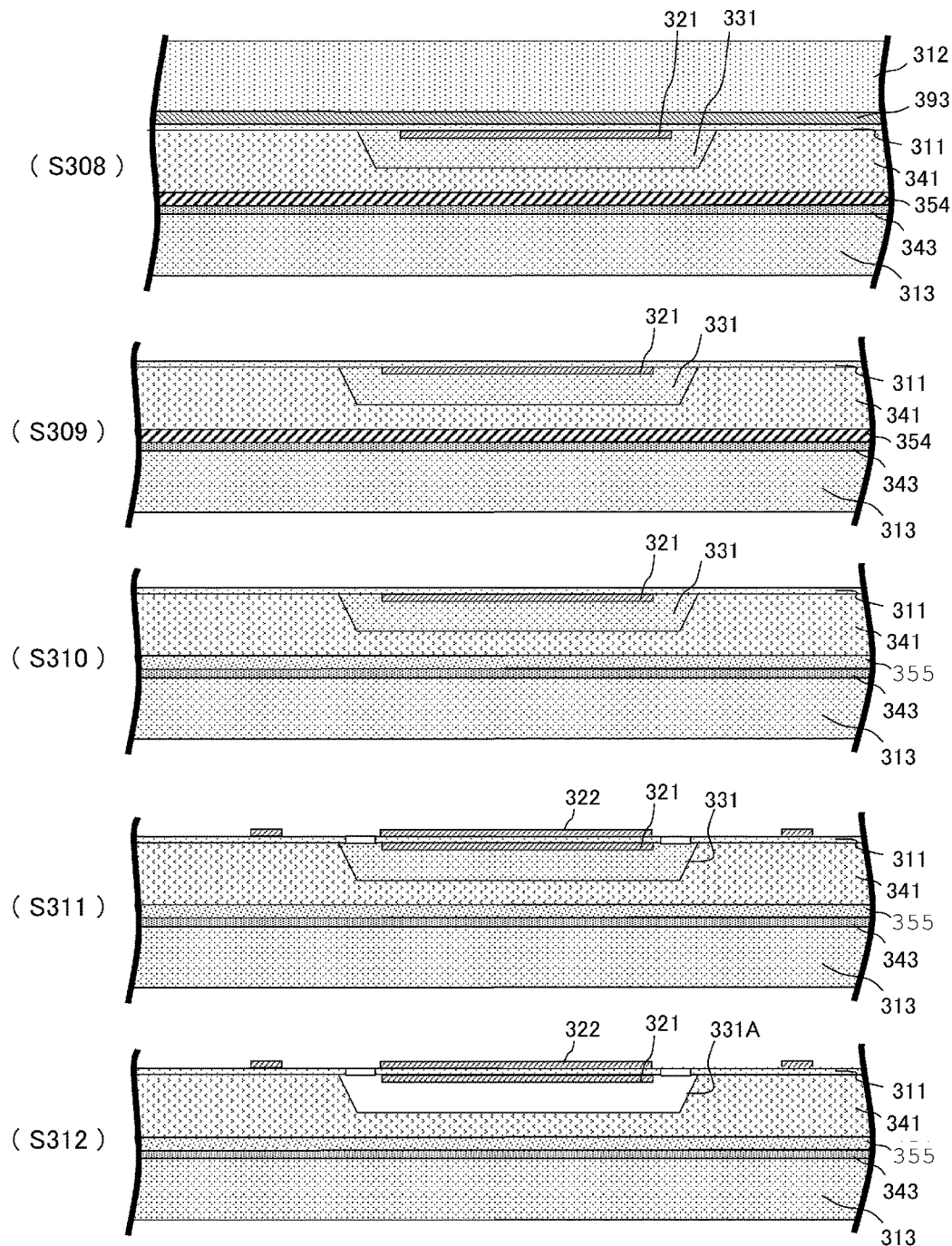
FIG. 11 includes schematic views showing the steps in the production flow shown in FIG. 9.

Next, as shown in FIG. 11 (S308), by overlaying the metal layer 353 (reference sign not shown) on the support substrate 313 side and the metal layer 351 (reference sign not shown) on the thin film temporary support structure 300 side on each other, a metal bonded layer 354 is formed. The steps of forming the metal layers 351 and 353 and the bonding step are continuously carried out in a high vacuum. As a result, bonding between the metal layers 351 and 353 is achieved.

Next, the laminate in which the piezoelectric single crystal thin film 311, the temporary support substrate 312, and the support substrate 313 are bonded together is immersed in an etching solution, such as nitric acid. As a result, the bonded etching layer 393 is etched, and the bonded etching layer 393 and the temporary support substrate 312 are removed. Thus, as shown in FIG. 11 (S309), a structure in which the piezoelectric single crystal thin film 311 and the support substrate 313 are bonded to each other with the metal bonded layer 354 interposed therebetween is obtained.

Next, as shown in FIG. 11 (S310), the metal bonded layer 354 (reference sign not shown) is oxidized by heating to form a semi-conducting layer 355.

Next, as shown in FIG. 11 (S311), the piezoelectric single crystal thin film 311 is subjected to windowing, and an upper electrode pattern to drive the BAW device is formed.

Next, as shown in FIG. 11 (S312), an etchant is introduced through the window of the piezoelectric single crystal thin film 311 into the dummy layer pattern 331 (reference sign not shown) to remove the dummy layer pattern 331 (reference sign not shown). Thus, a membrane space 331A is formed.

Subsequently, by performing singulation, a BAW device is produced.

The piezoelectric device according to a preferred embodiment of the present invention can be produced by the production method described above in each of the preferred embodiments. The piezoelectric device may be produced by other methods. For example, formation of the piezoelectric single crystal thin film may be achieved by, instead of ion implantation into the piezoelectric single crystal substrate and separation, sputter formation, grinding of a piezoelectric single crystal substrate, etching of a piezoelectric single crystal substrate, or the like. Furthermore, formation of the semi-conducting layer may be achieved, instead of oxidation of the metal layer by heating, sputter formation of a semi-conductor material, or bonding of a member serving as a semi-conducting layer to another member.

Furthermore, as the piezoelectric device, a SAW device and a BAW device are described as the preferred embodiments. However, the piezoelectric device is not limited thereto, and the present invention is also applicable to a boundary acoustic wave device in which an insulating layer is provided so as to cover an IDT electrode, a plate wave device, a Lamb wave device, and others.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A method for producing a piezoelectric device comprising:

a laminate formation step in which a laminate including a piezoelectric thin film, a support substrate, a metal layer, a silicon oxide layer formed on an upper surface of the metal layer and another silicon oxide layer formed on a lower surface of the metal layer, wherein the metal layer, the silicon oxide layer formed on the upper surface of the metal layer and the another silicon oxide layer formed on the lower surface of the metal layer are interposed between the piezoelectric thin film and the support substrate;

a semi-conducting layer formation step in which a semi-conducting layer is formed by oxidizing the metal layer; and a functional electrode formation step in which a functional electrode that is electro-mechanically coupled to the piezoelectric thin film is formed on a first principal surface of the piezoelectric thin film; wherein the semi-conducting layer is a layer composed of a mixture of a metal constituting the metal layer and an oxide of the metal, or a layer composed of a semiconductor which is an oxide of a metal constituting the metal layer.

2. The method for producing a piezoelectric device according to claim 1, further comprising an oxide layer formation step in which the silicon oxide layer is formed on a piezoelectric substrate directly or indirectly, and another oxide layer formation step in which the another silicon oxide layer is formed on the support substrate directly or indirectly, the oxide layer formation step is performed prior to the laminate formation step.

3. The method for producing a piezoelectric device according to claim 1, wherein the laminate formation step is continuously carried out in an inert gas atmosphere or in a vacuum.

4. The method for producing a piezoelectric device according to claim 1, further comprising:

an ion implantation step in which an ionized element is implanted from a bonding surface of a piezoelectric substrate to form a region of the piezoelectric substrate in which the ionized element is concentrated; and a separation step in which a region of the piezoelectric substrate on the bonding surface of the piezoelectric substrate is separated at the region of the piezoelectric substrate in which the ionized element is concentrated, by heating, so that the region of the piezoelectric substrate on the bonding surface of the piezoelectric substrate remains as the piezoelectric thin film.

5. The method for producing a piezoelectric device according to claim 1, further comprising:

an ion implantation step in which an ionized element is implanted into a piezoelectric substrate to form a region of the piezoelectric substrate in which the ionized element is concentrated;

a temporary support step in which a temporary support substrate is provided on a surface side of the piezoelectric substrate in which the ionized element was implanted, the temporary support substrate being composed of a same material as that of the piezoelectric substrate, or having a smaller thermal stress acting on an interface with the piezoelectric substrate than a thermal stress acting on an interface between the support substrate and the piezoelectric substrate;

a separation step in which the piezoelectric thin film is formed by being separated from the piezoelectric substrate by heating; and a support step in which the support substrate is provided on the piezoelectric thin film separated from the piezoelectric substrate.

* * * * *